(12) United States Patent
Dovzhenko et al.

(10) Patent No.: US 11,620,263 B2
(45) Date of Patent: Apr. 4, 2023

(54) DATA COMPRESSION USING DICTIONARIES

(71) Applicant: EMC IP Holding Company LLC, Hopkinton, MA (US)

(72) Inventors: Denis Dovzhenko, Saint-Petersburg (RU); Shaul Dar, Petach Tikva (IL); Haiyun Bao, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/403,985

(22) Filed: Aug. 17, 2021

(65) Prior Publication Data

US 2022/0197868 A1 Jun. 23, 2022

(30) Foreign Application Priority Data

Dec. 17, 2020 (RU) .......................... RU2020141594

(51) Int. Cl.
*G06F 16/174* (2019.01)
*G06F 16/13* (2019.01)

(52) U.S. Cl.
CPC ........ *G06F 16/1744* (2019.01); *G06F 16/137* (2019.01)

(58) Field of Classification Search
CPC .......................... G06F 16/1744; G06F 16/137
See application file for complete search history.

(56) References Cited

U.S. PATENT DOCUMENTS

| 2004/0230424 | A1* | 11/2004 | Gunawardana | ......... G10L 15/07 704/219 |
| 2011/0145238 | A1* | 6/2011 | Stork | ................... G06K 9/6219 707/E17.047 |
| 2014/0201208 | A1* | 7/2014 | Satish | ................... G06F 21/564 707/737 |
| 2016/0352766 | A1* | 12/2016 | Flacher | .................. H04L 12/28 |
| 2017/0123677 | A1* | 5/2017 | Singhai | ................... G06F 16/00 |
| 2017/0301354 | A1* | 10/2017 | Guo | ...................... G10L 19/008 |
| 2018/0234234 | A1* | 8/2018 | Hurley | .................. H04L 9/0643 |
| 2018/0357262 | A1* | 12/2018 | He | ......................... G06F 16/285 |
| 2019/0028723 | A1* | 1/2019 | Swaminathan | ........ H04N 19/42 |
| 2019/0065519 | A1* | 2/2019 | Ohtsuji | ............... G06F 16/1748 |
| 2019/0379394 | A1* | 12/2019 | Hallak | ............... G06F 16/1744 |
| 2020/0074080 | A1* | 3/2020 | Srinivasagopalan | ....................... G06F 21/563 |

(Continued)

*Primary Examiner* — James Trujillo
*Assistant Examiner* — Michal Bogacki
(74) *Attorney, Agent, or Firm* — Muirhead and Saturnelli, LLC

(57) ABSTRACT

Data units of a dataset may be compressed by clustering the data units into clusters, selecting a reference unit for each unit cluster, and compressing data units of each unit cluster using the reference unit of the unit cluster as a dictionary. The computational efficiency of the clustering algorithm may be improved by not applying it to data units themselves, but rather to hash values of the data units, where the hash values have a much smaller size than the data units. The hash function may be a locality-sensitive hash (LSH) function. The reference unit of a cluster may be determined in any of a variety of ways, for example, by selecting a centroid or exemplar of the cluster. Clusters, including their references values, may be indexed in a cluster index (e.g., a Faiss index), which may be searched to assign future added or modified data units to clusters.

20 Claims, 5 Drawing Sheets

(56) References Cited

U.S. PATENT DOCUMENTS

| | | | |
|---|---|---|---|
| 2020/0387743 A1* | 12/2020 | Wick | G06F 16/2228 |
| 2021/0019556 A1* | 1/2021 | Ganguly | H04L 9/0643 |
| 2021/0133881 A1* | 5/2021 | Egger | G06N 10/00 |
| 2021/0357706 A1* | 11/2021 | Chidambaram | G06N 20/00 |

* cited by examiner

DATA COMPRESSION USING DICTIONARIES

BACKGROUND

Technical Field

This application generally relates to data compression, in particular dictionary-based data compression on data storage systems.

Description of Related Art

Systems may include different resources used by one or more host processors. The resources and the host processors in the system may be interconnected by one or more communication connections, such as network connections. These resources may include data storage devices such as those included in data storage systems. The data storage systems may be coupled to one or more host processors and provide storage services to each host processor. Multiple data storage systems from one or more different vendors may be connected and may provide common data storage for the one or more host processors.

A host may perform a variety of data processing tasks and operations using the data storage system. For example, a host may issue I/O operations, such as data read and write operations, received at a data storage system. The host systems may store and retrieve data by issuing the I/O operations to the data storage system containing a plurality of host interface units, disk drives (or more generally storage devices), and disk interface units. The host systems access the storage devices through a plurality of channels provided therewith. The host systems provide data and access control information through the channels to a storage device of the data storage system. Data stored on the storage device may also be provided from the data storage system to the host systems also through the channels. The host systems do not address the storage devices of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In an embodiment of the invention, a method is performed, including: for a plurality of data units, determining a plurality of clusters of data units based on an extent of similarity of content between the plurality of data units; for each of the plurality of clusters, selecting one or more of the data units as a reference portion for the cluster; and for each cluster, compressing each data unit of the cluster based at least in part on the one or more reference portions of the cluster. For each cluster, each data unit of the cluster may be compressed using a compression technology that uses the one or more reference portions of the cluster as a dictionary. Determining the plurality of clusters may include, for each of the plurality of data units: generating a hash value for the data unit; and determining an extent of similarity of the data unit to other data units of the plurality of data units based at least in part on the generated hash value. For each of the plurality of clusters, selecting one or more of the data units as a reference portion for the cluster may include running a clustering algorithm in training mode to select the one or more reference portions. The method may include: receiving a write operation to an additional data unit not included in the plurality of data units; assigning the additional data unit to a first of the plurality of clusters; and compressing the additional data unit using the reference portion of the first cluster. The additional data unit may be assigned to the first cluster based at least in part on its proximity in data space to the representative portion of the first cluster. The method further may include, for at least a first reference portion, determining whether to maintain the first reference portion in compressed form or uncompressed form based at least on: how much memory space is consumed by the first reference portion in uncompressed form; and how frequently the first reference portion is used.

In another embodiment of the invention, a system has executable logic that implements a method including: for a plurality of data units, determining a plurality of clusters of data units based on an extent of similarity of content between the plurality of data units; for each of the plurality of clusters, selecting one or more of the data units as a reference portion for the cluster; and, for each cluster, compressing each data unit of the cluster based at least in part on the one or more reference portions of the cluster. For each cluster, each data unit of the cluster may be compressed using a compression technology that uses the one or more reference portions of the cluster as a dictionary. Determining the plurality of clusters may include, for each of the plurality of data units, generating a hash value for the data unit, and determining an extent of similarity of the data unit to other data units of the plurality of data units based at least in part on the generated hash value. For each of the plurality of clusters, selecting one or more of the data units as a reference portion for the cluster may include running a clustering algorithm in training mode to select the one or more reference portions. The method further may include: receiving a write operation to an additional data unit not included in the plurality of data units; assigning the additional data unit to a first of the plurality of clusters; and compressing the additional data unit using the reference portion of the first cluster. The additional data unit may be assigned to the first cluster based at least in part on its proximity in data space to the representative portion of the first cluster. The system further may include, for at least a first reference portion: determining whether to maintain the first reference portion in compressed form or uncompressed form based at least on: how much memory space is consumed by the first reference portion in uncompressed form; and how frequently the first reference portion is used.

In another embodiment of the invention, computer-readable media has software stored thereon, the software including: executable code that, for a plurality of data units, determines a plurality of clusters of data units based on an extent of similarity of content between the plurality of data units; executable code that, for each of the plurality of clusters, selects one or more of the data units as a reference portion for the cluster; and executable code that, for each cluster, compresses each data unit of the cluster based at least in part on the one or more reference portions of the cluster. For each cluster, each data unit of the cluster may be compressed using a compression technology that uses the one or more reference portions of the cluster as a dictionary. Determining the plurality of clusters may include, for each of the plurality of data units: generating a hash value for the data unit; and determining an extent of similarity of the data unit to other data units of the plurality of data units based at least in part on the generated hash value. The software further may include: executable code that receives a write operation to an additional data unit not included in the plurality of data units; executable code that assigns the additional data unit to a first of the plurality of clusters; and executable code that compresses the additional data unit using the reference portion of the first cluster. The additional data unit may be assigned to the first cluster based at least in part on its proximity in data space to the representative portion of the first cluster. The software further may include, for at least a first reference portion, executable code that determines whether to maintain the first reference portion in compressed form or uncompressed form based at least on: how much memory space is consumed by the first reference portion in uncompressed form; and how frequently the first reference portion is used.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
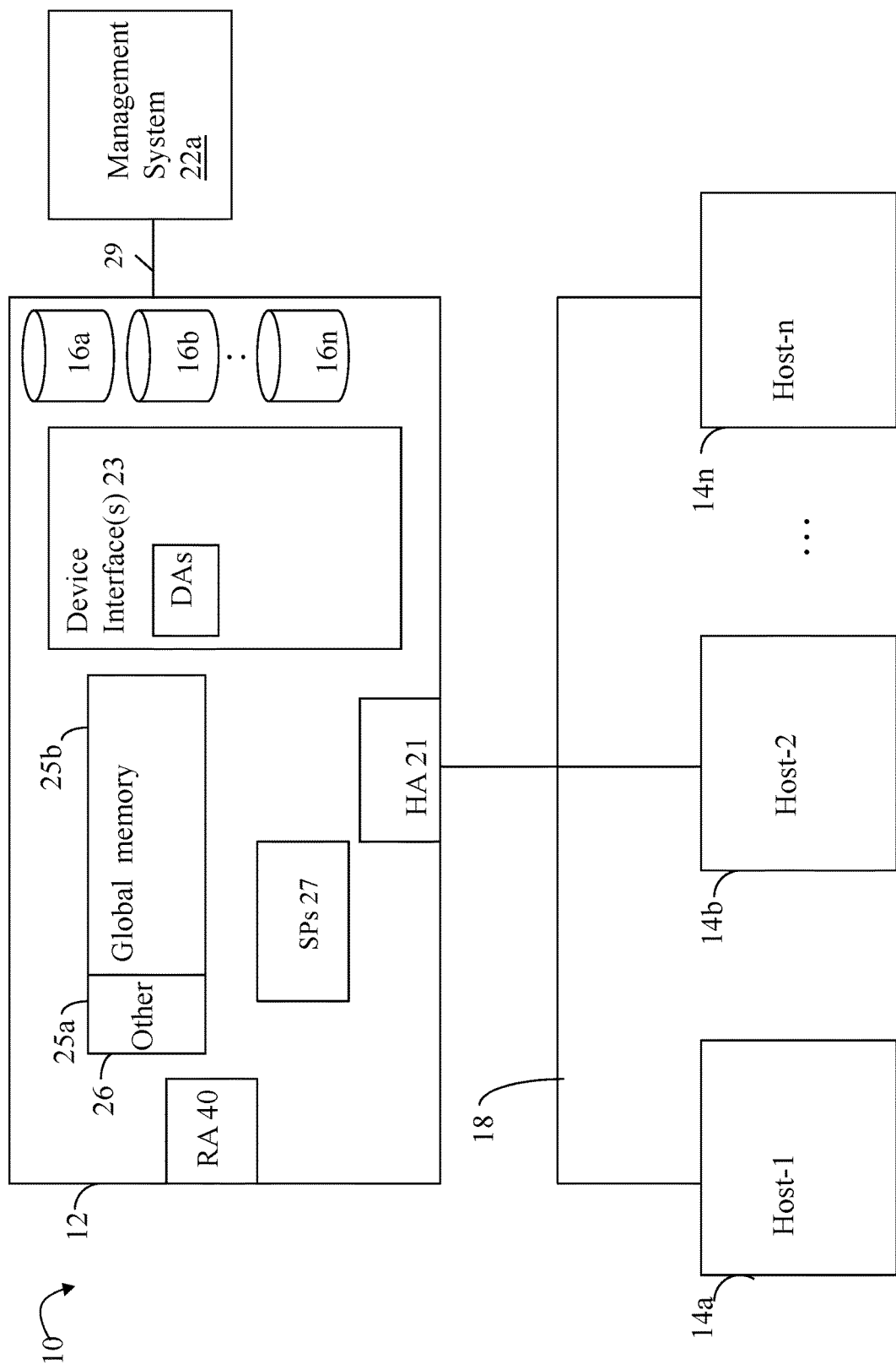
FIG. 1 is an example of components that may be included in a system in accordance with the techniques described herein.

Effective data reduction is one of the most important capabilities of data storage systems today, often measured by data reduction ratio (DRR). Compression is often a critical component of a data reduction strategy. Some data storage systems, for example, PowerStore™ systems and other storage systems available from EMC Corp. of Hopkinton, Mass., may use standard compression algorithms such as, for example, Zstandard (i.e., Zstd) to compress data. To reduce the CPU overhead of compression and decompression, these functions may be offloaded to an external hardware engine such as, for example, an engine implementing Intel® QuickAssist Technology (QAT).

Recently is has been demonstrated that compression using dictionaries can achieve significant improvements in both the compression ratio as well as compression and decompression time. A "dictionary" is a unit of data against with other units of data are compared to perform compression. That is, rather than compressing a unit of data—e.g., a file or block of data storage—based on the contents of the data unit itself, which may be referred to herein as "self-compression," a data unit may be compared to a designated data unit—the dictionary. For example, Zstd includes a training mode, the performance of which builds dictionaries from representative datasets. However, a crucial question is how to construct such representative datasets from which dictionaries can be built. In the case of block storage, each block may have a size, for example, of 4 KB=32,768 bits, in which case the data space includes $2^{32768}$ different potential block values. Sampling this huge space and coming up with a finite number of "reference units" that can serve as dictionaries can be a significant challenge.

What may be desirable is an improved technique for constructing datasets for data units of a relatively large data space, from which reference units that serve as dictionaries may be determined. More generally, what may be desirable is an improved dictionary-based compression for data, which scales well to a relatively large data space.

Described herein are techniques and mechanisms for compressing data units of a dataset (e.g., data stored on a data storage system) by clustering the data units into clusters, selecting a reference unit for each cluster, and compressing current and future data units of each cluster using the reference unit of the cluster as a dictionary. The number of clusters generated may be orders of magnitude smaller than the numbers of actual data units in the data space. Dictionary-based compression of data units against reference units of their respective clusters should generally have a higher data compression ratio than a data compression ratio generated by self-compression or by applying reference units not determined from clustering.

Any of a variety of clustering algorithms may be applied, including, for example, PQk-means, k-means or hdbscan, for example, using machine-learning (ML) technology. The clustering algorithm used may be selected based on any of a variety of factors, including, but not limited to: the computational resources, memory resources and/or networking resources available; the size of the data space being clustered (e.g., based on the number of bits of the values being compressed); the expected amount (e.g., generally) of data units to be clustered; and the scalability, speed, computational efficiency and overhead of the clustering algorithm, which may in part depend on any of the other foregoing factors.

In some embodiments, to improve the computational efficiency of the clustering algorithm, the clustering algorithm is not applied to data units themselves, but rather to hash values of the data units, where the hash values have a much smaller size than the data units. For example, if the data unit is a standard storage block having a size of 4 KB (32,768 bits), a hash function may be applied to data units to produce hashes having a size of 8 bytes (64 bits)—1/512 of the size of the data unit. In some embodiments, the hash function may be a locality-sensitive hash (LSH) function for which data units having similar bit values will produce similar or even the same hash values. For example, the LSH function may be a variation of the sim-hash function based on a combination of xx-hash functions. The clustering algorithm may be applied against the smaller (e.g., 8 byte) values, as opposed to the larger (e.g., 4 KB) values, thereby reducing the computational complexity of the clustering function, to produce what may be referred to herein as "hash clusters" (a cluster produced by applying a clustering algorithm to the data units themselves (i.e., not hashed) may be referred to herein a "unit cluster"). The smaller bit-size of the hash values reduces the size of the data space and computational complexity, which may impact the choice of clustering algorithm. It should be appreciated that the term "cluster" without the modifier "unit" and "hash" may be used herein to generically refer to both unit clusters and hash clusters.

In some embodiments, a distance metric function configured for the clustering algorithm is the bit distance between the LSH vectors (i.e., hash values), which may be interpreted by the clustering algorithm as, for example, a Euclidean or Manhattan distance in a 64-dimensional space. Note that such a distance function is symmetric and satisfies the triangle equality, i.e., $d(a,c) \leq d(a,b)+d(b,c)$. For example, as each bit has a binary value, determining the Euclidean or Manhattan distance may be as simple as performing a bit-by-bit comparison between a data unit or hash value thereof and the reference unit or reference hash (described below), respectively. In such embodiments, the greater the number of matching bits, the shorter the distance, and the more similar are the data unit (or hash value) and the reference unit (or reference hash).

The reference unit of a cluster may be determined in any of a variety of ways, for example, by running a compression engine (e.g., implementing Zstd) in training mode on the cluster, or by selecting a centroid or exemplar of the cluster. For example, a clustering engine implementing a clustering algorithm to produce the clusters may be configured to select the centroid or exemplar of the cluster. In embodiments in which hash clusters are generated from hash values of the data units, a reference hash value ("reference hash") of the hash cluster may be determined, for example, using any of the techniques described above or elsewhere herein. If the reference hash maps to multiple data units (i.e., if multiple data units generated the same reference hash), then one of the multiple data units may be selected to serve as the reference unit of the cluster corresponding to the hash cluster. Selecting which such data unit to serve as the reference unit of the cluster in such circumstances may include using any of a variety of techniques, including, for example: selecting the data unit having the lowest or highest value; selecting the most recently written or least recently written data unit, or the data unit having a highest or lowest storage address (e.g., logical bit address) or even by quasi-random selection.

The hash clusters, including their references hashes (or analogously the unit clusters and reference units if data units are not hashed for clustering) may be indexed in an index referred to herein as a "cluster index," which may be used (i.e., searched) to assign future added or modified data units to clusters (e.g., hash clusters and/or corresponding unit clusters). For example, in some embodiments of the invention, a Faiss index based on FAISS (Facebook AI Similarity Search) technology may be employed to index hash clusters and their reference hashes, and to search for clusters and their corresponding reference data to assign new and/or modified data units.

In some embodiments, a hierarchical clustering approach may be employed to further increase the computational efficiency of clustering data units. For example, the data space of the data units may be divided into sub-regions, and data units that fall within each sub-region may be clustered independently of all data units that fall into the other regions. For example, a $2^{32,768}$-bit space may be sub-divided into 1,000 sub-regions according to the value of the bits, where, for each sub-region, a cluster is comprised of all the data units that fall within the sub-region. To illustrate using a small example, if each data unit was only one byte (8 bits), the data space would have a size of $2^8=256$, and the values in the data space would range from 00000000 to 11111111. This data space may be divided into 8 sub-regions having ranges of: {00000000-00011111; 00100000-00111111; 01011111-01111111; 10000000-10011111; 10100000-10111111; 11000000-11011111; 11100000-11111111}.

Each of the units in the (e.g., 1,000) top-level regions may be clustered into sub-clusters using any of the techniques described herein. The sub-clustering of the top-level regions can be done in parallel, with each sub-clustering being less computational expensive than if clustering were performed on the entire data space, as the number of data units to be clustered for each top-level region, and also the number of required clusters would be much less, likely orders of magnitude less than if clusters were determined for the entire dataspace.

In some embodiments, multiple reference units may be determined for each data unit, for example, by selecting, for each hash cluster, two or more of the data units from which the reference hash of the cluster was generated. Multiple reference units also may be selected by selecting multiple reference hashes, for example, a certain predefined number of hash values closest to a centroid of the hash cluster. For example, the multiple reference units may be concatenated together, and applied as dictionaries to compress a data unit.

When multiple reference units are used for a cluster, there is a greater likelihood of a higher compression ratio of each data unit of the cluster, as more data units are available to match values, symbols, patterns, etc., in accordance with whatever compression is being used, However, the computational cost of the compression may be greater. Further, when multiple reference units are used, more memory resources (e.g., of a compression engine) may be consumed because more data (i.e., the data of multiple reference units as opposed to one reference unit) may need to be retained in memory to perform the compression.

It should be appreciated that, in some embodiments, it may be determined that a data unit does not belong to any cluster because it does not fit well enough within any cluster, which may occur if the data unit's data resides in a sparse region of the data space. For example, it may be determined whether the data unit is within a predefined minimum distance (e.g., Euclidean distance) of any of the clusters, where each such minimum distance may be considered a boundary of the respective cluster. If it is determined that the data unit is not within the minimum distance, dictionary-based compression may not be applied to the data unit, but rather the data unit may be compressed based on its own contents—i.e., self-compression may be applied.

Clustering may be performed using a clustering engine embodied in hardware, firmware and/or software, which may employ ML technology. The parameters of the clustering engine may be optimized to produce clusters and reference data (e.g., a reference unit and/or reference hash) that provides the desired (e.g., optimal) compression, which may be based on any of the factors described herein. Determining optimal clustering parameters may include employing hyperparameter tuning techniques.

In some embodiments of the invention, an initial data reduction of the existing data units of a dataset may be performed, e.g., "offline"—i.e., independent of any I/O operations involving the data units. For example, the initial clustering may be performed by offloading the data clustering to cluster of nodes employing GPUs. The existing data units may be hashed, clustered and compressed using the techniques described above and elsewhere herein. For a dataset (e.g., stored on a storage system) that is in the process of being populated, this process may not be initiated until there is a sufficient (e.g., a predefined minimum) amount of data to produce desirable clusters—e.g., clusters that should produce good compression ratios for the current data and future data of the dataset.

In some embodiments of the invention, after clusters have been generated from the existing data of the dataset, the clusters may be applied to new or modified data units, for example, in an inline fashion as the data is written to storage. For example, when a write operation results in writing data to a new data unit, the data unit may be assigned to a cluster to which it fits best. Assignment may include searching an index (e.g., Faiss index) of clusters to determine the best fit. In some embodiments, assignment of a data unit may include generating a hash value of the data unit and determining the reference hash of the dataset that is closest (e.g., in Euclidian distance) to the hash value, for example by doing a bit-wise comparison as describe elsewhere herein. The data unit may be compressed using dictionary-based compression by using one or more reference units corresponding to the closest one or more reference hashes as the one or more dictionaries for compression.

In some embodiments, a data unit may not be assigned to a cluster if the data unit is determined to not fit well enough in any cluster. For example, it may be determined whether the data unit is within a predefined minimum distance of any of the clusters, and, if not, may not be assigned to any cluster. In the event a data unit is not assigned to a cluster, dictionary-based compression may not be applied to the data unit, but rather self-compression may be applied. Such a data unit may be referred to herein as an "outlier."

In some embodiments, aspects of hierarchical clustering described elsewhere herein may be applied when assigning a data unit to a cluster. For example, a sub-region of the data space to which the data unit belongs may be determined, and a cluster corresponding to the sub-region determined. The data unit may be compressed, and it may be determined whether the data unit is close enough to any hash sub-cluster of the determined sub-region cluster. If no hash sub-cluster is close enough, self-compression may be applied to the data unit. Otherwise, one or more reference units corresponding to the closest hash sub-cluster may be used as a dictionary to compress the data unit, for example, as described in more detail elsewhere herein.

In some embodiments, the reference units that are used as dictionaries for compression may be kept in local memory, for example, within the main memory of a CPU, GPU or combination thereof ("processing unit") of a device or hardware component thereof (e.g., hardware engine) that performs the compression, or on a same chip or board as the processing unit or hardware engine, e.g., as dual inline memory module (DIMM), or a suitable combination of any two or more of the foregoing. The reference units may be stored in memory uncompressed or in compressed (e.g., self-compressed) form. It may be desirable to maintain a reference unit in local memory in compressed form if it is accessed relatively infrequently, for example, if data units that belong (or are determined to belong) to the unit cluster of the reference unit are only accessed once every day or so, in which case the benefit of conserving memory may outweigh the computation cost and time consumption of decompressing the reference unit when needed. It may be desirable to maintain a reference unit in local memory in uncompressed form if it is accessed relatively frequently, for example, if data units that belong (or are determined to belong) to the unit cluster of the reference unit are written every second or so, or even more frequently, in which case the benefit of saving time and computation cost by not having to decompress the compressed reference unit may outweigh the memory consumption of the uncompressed reference unit. In some embodiments, forecasting (e.g., prediction) may be applied to determine which times data units belonging to (or that will be determined to belong to) the unit cluster of the reference unit will be referenced, and the reference unit may be kept in memory in compressed or uncompressed form accordingly.

In some embodiments, the data unit of a dataset may be re-clustered. For example, predefined metrics of the current clusters may be measured (e.g., periodically), and, and it may be decided to re-cluster the data units based on current and/or past values of such metrics, for example, trends or patterns identified from such metric values. Such metrics may include the average distance of LSH vectors (e.g., hash values) from a centroid of the hash cluster of the data unit; percentage of outliers from the dataset; percentage of outliers of "new" data units (i.e., data units assigned after the clusters were initially generated. For example, thresholds may be set for one or more of the foregoing metrics, and measured values of those metrics compared against those thresholds. If the measured values of one or more metrics pass (e.g., exceed or fall below, depending on the metric) their respective thresholds (or in some cases equal the threshold), it may be determined to re-cluster the data units of a dataset. Other metrics related to the clusters, for example, the resulting data compression ratio of the dataset or one or more sub-portions (e.g., logical volumes) thereof may be measured (e.g., periodically). It may be determined whether to re-cluster the clusters based on one or more measured data compression ratios, in some embodiments in combination with the value(s) of one more cluster metric values described above; for example, by defining and comparing against thresholds as described above.

The measured metrics may reveal that re-clustering should be performed when, for example, the number of datasets added since the data clusters were initially established is substantially greater than the number of datasets in the initial data clusters and/or when significant modifications have been made to the original data units of the initial clusters.

In embodiments in which hierarchical clustering is employed, it may be determined to re-cluster less than all (e.g., one or more) of the sub-clusters, for example, based on the values of one or more measured metrics for the sub-cluster, as described above for clusters.

Illustrative embodiments of the invention will now be described in more detail in relation to the figures.

Referring to the FIG. 1, shown is an example of an embodiment of a system 10 that may be used in connection with performing the techniques described herein. The system 10 includes a data storage system 12 connected to the host systems (also sometimes referred to as hosts) 14a-14n through the communication medium 18. In this embodiment of the system 10, the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host systems 14a-14n and data storage system 12 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the hosts 14a-14n and the data storage system 12 may all be located at the same physical site, or, alternatively, may also be located in different physical locations. The communication medium 18 used for communication between the host systems 14a-14n and the data storage system 12 of the system 10 may use a variety of different communication protocols such as block-based protocols (e.g., SCSI, Fibre Channel, iSCSI), file system-based protocols (e.g., NFS or network file server), and the like. Some or all of the connections by which the hosts 14a-14n and the data storage system 12 may be connected to the communication medium 18 may pass through other communication devices, such as switching equipment, a phone line, a repeater, a multiplexer or even a satellite.

Each of the host systems 14a-14n may perform data operations. In the embodiment of the FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although the element 12 is illustrated as a single data storage system, such as a single data storage array, the element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrating the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of physical data storage devices (PDs) 16a-16n. The PDs 16a-16n may include one or more types of physical data storage devices such as, for example, one or more rotating disk drives and/or one or more solid state drives (SSDs). An SSD is a data storage device that uses solid-state memory to store persistent data. SSDs may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single-level cell) devices and/or MLC (multi-level cell) devices.

The data storage array may also include different types of adapters or directors, such as an HA 21 (host adapter), RA 40 (remote adapter), and/or device interface(s) 23. Each of the adapters may be implemented using hardware including a processor with a local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from one of the hosts 14a-n. The data storage array may include one or more RAs that may be used, for example, to facilitate communications between data storage arrays. The data storage array may also include one or more device interfaces 23 for facilitating data transfers to/from the PDs 16a-16n. The data storage device interfaces 23 may include device interface modules, for example, one or more disk adapters (DAs) (e.g., disk controllers) for interfacing with the flash drives or other PDs (e.g., PDs 16a-n). The DAs may also be characterized as back end components of the data storage system which interface with the PDs.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, the HAs and/or the RAs in a data storage array. In one embodiment, the device interfaces 23 may perform data operations using a system cache that may be included in the global memory 25b, for example, when communicating with other device interfaces and other components of the data storage array. The other portion 25a is that portion of the memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

The host systems 14a-14n provide data and access control information through channels to the storage systems 12, and the storage systems 12 may also provide data to the host systems 14a-n also through the channels. The host systems 14a-n do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of storage space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or, more generally, PDs. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may include one or more type of device interface used in connection with facilitating data transfers to/from the associated disk drive(s) and LUN(s) residing thereon. For example, such device interfaces may include a device interface used in connection with facilitating data transfers to/from the associated flash devices and LUN(s) residing thereon. It should be noted that an embodiment may use the same or a different device interface for one or more different types of devices than as described herein.

In an embodiment in accordance with the techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of the techniques herein may be made with respect to a physical data storage system and its physical components (e.g., physical hardware for each HA, DA, HA port and the like), the techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in the FIG. 1 is a management system 22*a* that may be used to manage and monitor the data storage system 12. In one embodiment, the management system 22*a* may be a computer system which includes data storage system management software or application such as may execute in a web browser. A data storage system manager may, for example, view information about a current data storage configuration such as LUNs, storage pools, and the like, on a user interface (UI) in a display device of the management system 22*a*. Alternatively, and more generally, the management software may execute on any suitable processor in any suitable system. For example, the data storage system management software may execute on a processor of the data storage system 12.

Information regarding the data storage system configuration may be stored in any suitable data container, such as a database. The data storage system configuration information stored in the database may generally describe the various physical and logical entities in the current data storage system configuration. The data storage system configuration information may describe, for example, the LUNs configured in the system, properties and status information of the configured LUNs (e.g., LUN storage capacity, unused or available storage capacity of a LUN, consumed or used capacity of a LUN), configured RAID groups, properties and status information of the configured RAID groups (e.g., the RAID level of a RAID group, the particular PDs that are members of the configured RAID group), the PDs in the system, properties and status information about the PDs in the system, local replication configurations and details of existing local replicas (e.g., a schedule or other trigger conditions of when a snapshot is taken of one or more LUNs, identify information regarding existing snapshots for a particular LUN), remote replication configurations (e.g., for a particular LUN on the local data storage system, identify the LUN's corresponding remote counterpart LUN and the remote data storage system on which the remote LUN is located), data storage system performance information such as regarding various storage objects and other entities in the system, and the like.

Consistent with other discussion herein, management commands issued over the control or data path may include commands that query or read selected portions of the data storage system configuration, such as information regarding the properties or attributes of one or more LUNs. The management commands may also include commands that write, update, or modify the data storage system configuration, such as, for example, to create or provision a new LUN (e.g., which may result in modifying one or more database tables such as to add information for the new LUN), to modify an existing replication schedule or configuration (e.g., which may result in updating existing information in one or more database tables for the current replication schedule or configuration), to delete a LUN (e.g., which may include deleting the LUN from a table of defined LUNs and may also include modifying one or more other database tables to delete any existing snapshots of the LUN being deleted), and the like.

It should be noted that each of the different adapters, such as each HA, DA, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16*a*-16*n*. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of the FIG. 1 may be a data storage system, such as a data storage array, that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, the memory 26 may represent memory of each such storage processor.

Generally, the techniques herein may be used in connection with any suitable storage system, appliance, device, and the like, in which data is stored. For example, an embodiment may implement the techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receive a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to the FIG. 1, the control commands may be issued from data storage management software executing on management system 22a to the data storage system 12. Such commands may be, for example, to establish or modify data services, provision storage, perform user account management, and the like. Consistent with other discussion herein, the management commands may result in processing that includes reading and/or modifying information in the database storing data storage system configuration information. For example, management commands that read and/or modify the data storage system configuration information in the database may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to the FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

Figure 2:
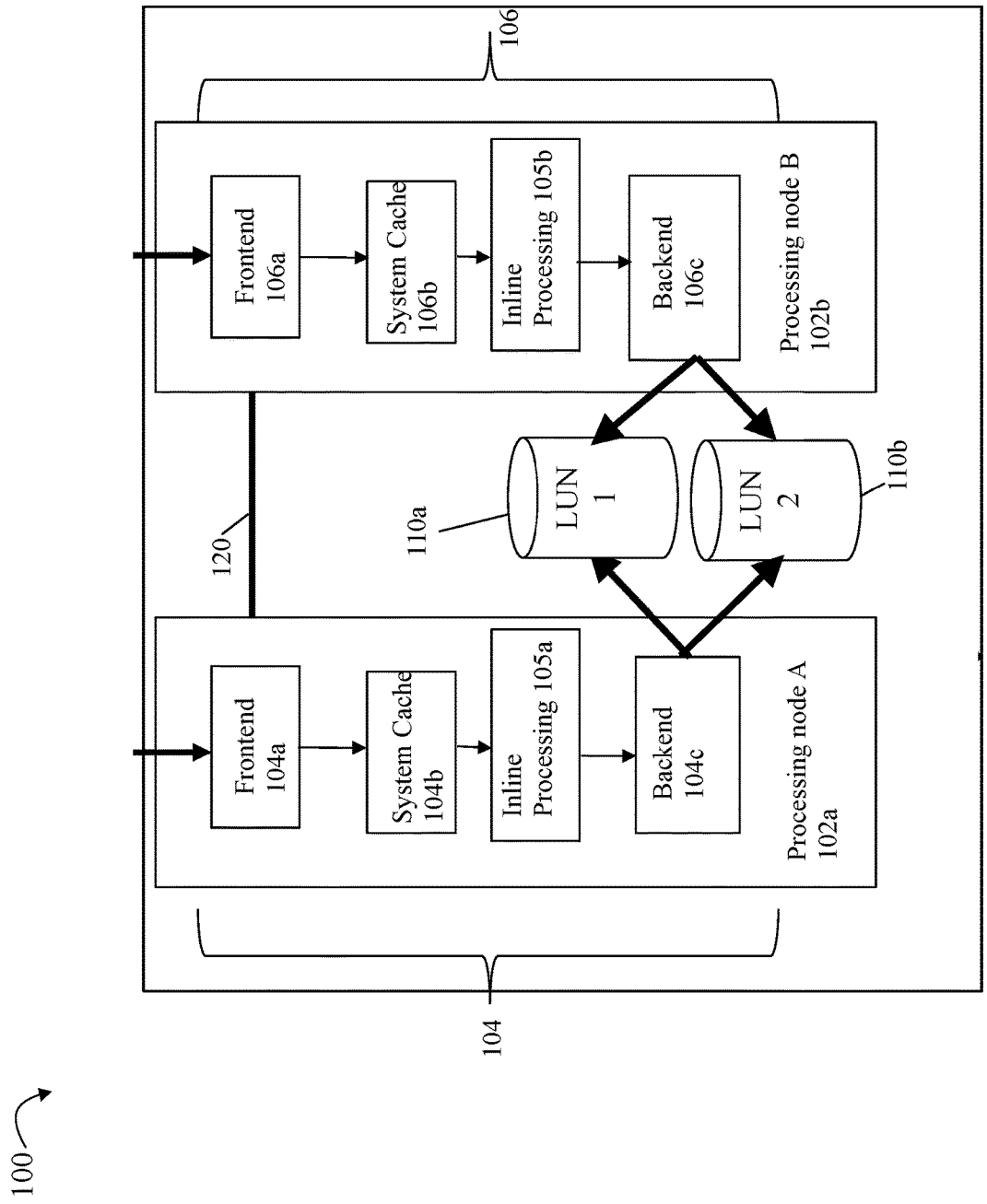
FIG. 2 is an example illustrating the I/O path or data path in connection with processing data in an embodiment in accordance with the techniques herein.

With reference to the FIG. 2, shown is an example 100 illustrating components that may be included in the data path in at least one existing data storage system in accordance with the techniques herein. The example 100 includes two processing nodes A 102a and B 102b and the associated software stacks 104, 106 of the data path, where I/O requests may be received by either processing node 102a or 102b. In the example 200, the data path 104 of processing node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and non-volatile physical storage (e.g., back-end physical non-volatile storage devices or PDs accessed by BE components such as DAs as described herein). During movement of data in and out of the system cache layer 104b (e.g., such as in connection with read data from, and writing data to, physical storage 110a, 110b), inline processing may be performed by layer 105a. Such inline processing operations of 105a may be optionally performed and may include any one of more data processing operations in connection with data that is flushed from system cache layer 104b to the back-end non-volatile physical storage 110a, 110b, as well as when retrieving data from the back-end non-volatile physical storage 110a, 110b to be stored in the system cache layer 104b. In at least one embodiment, the inline processing may include, for example, performing one or more data reduction operations such as data duplication or data compression. The inline processing may include performing any suitable or desirable data processing operations as part of the I/O or data path.

In a manner similar to that as described for data path 104, the data path 106 for processing node B 102b has its own FE component 106a, system cache layer 106b, inline processing layer 105b, and BE component 106c that are respectively similar to the components 104a, 104b, 105a and 104c. The elements 110a, 110b denote the non-volatile BE physical storage provisioned from PDs for the LUNs, whereby an I/O may be directed to a location or logical address of a LUN and where data may be read from, or written to, the logical address. The LUNs 110a, 110b are examples of storage objects representing logical storage entities included in an existing data storage system configuration. Since, in this example, writes directed to the LUNs 110a, 110b may be received for processing by either of the nodes 102a and 102b, the example 100 illustrates what may also be referred to as an active-active configuration.

In connection with a write operation as may be received from a host and processed by the processing node A 102a, the write data may be written to the system cache 104b, marked as write pending (WP) denoting it needs to be written to the physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned to the host (e.g., by component the

104*a*). At various points in time, the WP data stored in the system cache is flushed or written out to the physical storage 110*a*, 110*b*.

In connection with the inline processing layer 105*a*, prior to storing the original data on the physical storage 110*a*, 110*b*, one or more data reduction operations may be performed. For example, the inline processing may include performing data compression processing, data deduplication processing, and the like, that may convert the original data (as stored in the system cache prior to inline processing) to a resulting representation or form which is then written to the physical storage 110*a*, 110*b*.

In connection with a read operation to read a block of data, a determination is made as to whether the requested read data block is stored in its original form (in system cache 104*b* or on physical storage 110*a*, 110*b*), or whether the requested read data block is stored in a different modified form or representation. If the requested read data block (which is stored in its original form) is in the system cache, the read data block is retrieved from the system cache 104*b* and returned to the host. Otherwise, if the requested read data block is not in the system cache 104*b* but is stored on the physical storage 110*a*, 110*b* in its original form, the requested data block is read by the BE component 104*c* from the backend storage 110*a*, 110*b*, stored in the system cache and then returned to the host.

If the requested read data block is not stored in its original form, the original form of the read data block is recreated and stored in the system cache in its original form so that it can be returned to the host. Thus, requested read data stored on physical storage 110*a*, 110*b* may be stored in a modified form where processing is performed by 105*a* to restore or convert the modified form of the data to its original data form prior to returning the requested read data to the host.

Also illustrated in FIG. 2 is an internal network interconnect 120 between the nodes 102*a*, 102*b*. In at least one embodiment, the interconnect 120 may be used for internode communication between the nodes 102*a*, 102*b*.

In connection with at least one embodiment in accordance with the techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. The processor cache may be substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage. For example, in at least one embodiment, a RAM based memory may be one of the caching layers used as to cache the write data that is then flushed to the backend physical storage. When the processor performs processing, such as in connection with the inline processing 105*a*, 105*b* as noted above, data may be loaded from the main memory and/or other lower cache levels into its CPU cache.

In at least one embodiment, the data storage system may be configured to include one or more pairs of nodes, where each pair of nodes may be generally as described and represented as the nodes 102*a*-*b* in the FIG. 2. For example, a data storage system may be configured to include at least one pair of nodes and at most a maximum number of node pairs, such as for example, a maximum of 4 node pairs. The maximum number of node pairs may vary with embodiment. In at least one embodiment, a base enclosure may include the minimum single pair of nodes and up to a specified maximum number of PDs. In some embodiments, a single base enclosure may be scaled up to have additional BE non-volatile storage using one or more expansion enclosures, where each expansion enclosure may include a number of additional PDs. Further, in some embodiments, multiple base enclosures may be grouped together in a load-balancing cluster to provide up to the maximum number of node pairs. Consistent with other discussion herein, each node may include one or more processors and memory. In at least one embodiment, each node may include two multi-core processors with each processor of the node having a core count of between 8 and 28 cores. In at least one embodiment, the PDs may all be non-volatile SSDs, such as flash-based storage devices and storage class memory (SCM) devices. It should be noted that the two nodes configured as a pair may also sometimes be referred to as peer nodes. For example, the node A 102*a* is the peer node of the node B 102*b*, and the node B 102*b* is the peer node of the node A 102*a*.

In at least one embodiment, the data storage system may be configured to provide both block and file storage services with a system software stack that includes an operating system running directly on the processors of the nodes of the system.

In at least one embodiment, the data storage system may be configured to provide block-only storage services (e.g., no file storage services). A hypervisor may be installed on each of the nodes to provide a virtualized environment of virtual machines (VMs). The system software stack may execute in the virtualized environment deployed on the hypervisor. The system software stack (sometimes referred to as the software stack or stack) may include an operating system running in the context of a VM of the virtualized environment. Additional software components may be included in the system software stack and may also execute in the context of a VM of the virtualized environment.

In at least one embodiment, each pair of nodes may be configured in an active-active configuration as described elsewhere herein, such as in connection with FIG. 2, where each node of the pair has access to the same PDs providing BE storage for high availability. With the active-active configuration of each pair of nodes, both nodes of the pair process I/O operations or commands and also transfer data to and from the BE PDs attached to the pair. In at least one embodiment, BE PDs attached to one pair of nodes may not be shared with other pairs of nodes. A host may access data stored on a BE PD through the node pair associated with or attached to the PD.

In at least one embodiment, each pair of nodes provides a dual node architecture where both nodes of the pair may be identical in terms of hardware and software for redundancy and high availability. Consistent with other discussion herein, each node of a pair may perform processing of the different components (e.g., FA, DA, and the like) in the data path or I/O path as well as the control or management path.

In some embodiments, the system 10 and/or the example 100 may be configured to perform data reduction in the form of compression, for example, dictionary-based compression.

Figure 3:
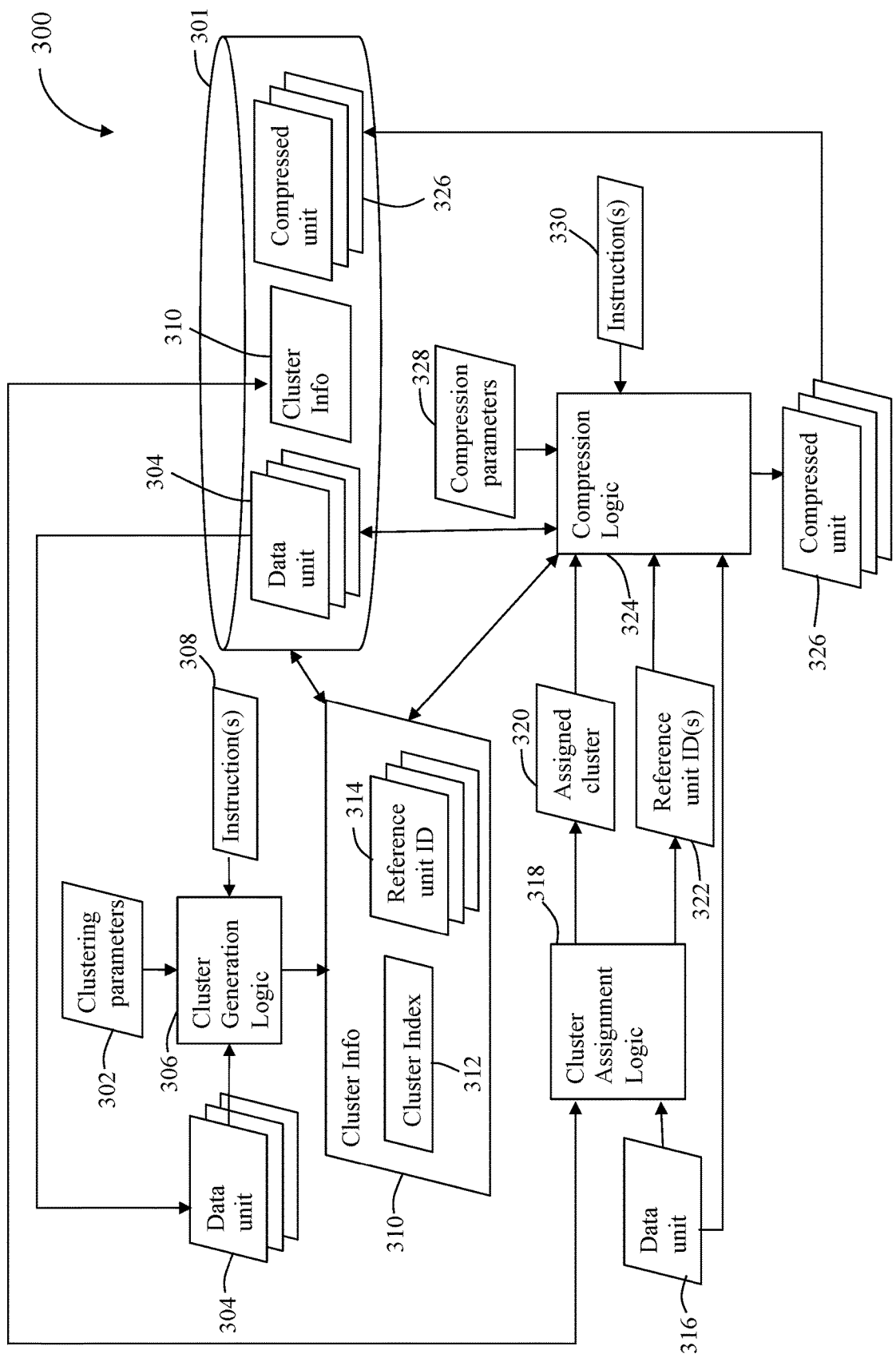
FIG. 3 is a data flow diagram illustrating an example of a system for compressing data units, according to embodiments of the invention.

FIG. 3 is a data flow diagram illustrating an example of a system 300 for compressing data units, according to embodiments of the invention. Other embodiments of a system for compressing data units, for example, variations of the system 300, are possible and are intended to fall within the scope of the invention. The system 300 may be implemented as part of the system 10 and/or example 100. The system 300 may be configured to perform dictionary-based compression, and may be configured to perform method 400, 500 and/or 600 described in relation to FIGS. 4, 5 and 6, respectively.

The system 300 may include any of: cluster generation logic 306; cluster information 310; data storage 301; cluster assignment logic 318; and compression logic 324. The cluster generation logic 306 may be configured to receive the plurality of data units 304 of a dataset, clustering parameters 302 and one or more instructions 308, and to generate cluster information 310, for example, according to techniques described in more detail elsewhere herein. The data units 304 may be, for example, data blocks of a data storage system, a combination of blocks (e.g., tracks or segments), or portions of any of the foregoing, and may be retrieved from the data storage 301, which may include a plurality of physical data storage devices (e.g., PDs 16a-n). The clustering parameters 306 may be determined using hyperparameter tuning. The instruction(s) 308 may include instructions (e.g., user input) to initiate, pause, delay or halt generating the cluster information, as well as other instructions, and may be received through a user interface, for example, a user interface provided by the management system 22a.

The cluster information 310 may specify a plurality of clusters (e.g., unit clusters or hash clusters), and, for each cluster, the one or more reference units thereof. For example, the cluster generation logic 306 may create a cluster index (e.g., a Faiss index) 312 of the generated clusters as described elsewhere herein. The cluster index 312 may specify the reference units corresponding to clusters, or reference unit IDs 314 may be stored separately, in a different data structure, which may be referenced (e.g., pointed to) by the cluster index 312. The cluster information 310 may be stored in the data storage 301.

The cluster assignment logic 318 may receive a data unit 316, for example, as part of processing a write operation specifying the data unit, e.g., as part of performing inline compression (e.g., as part of inline processing 105a or 105b). The data unit 316 may be new in that it is not already stored within the dataset stored in the data storage 301. The cluster assignment logic 318 may be configured to retrieve the cluster information 310, for example, from the data storage 301, and determine (e.g., using the cluster index 312) whether the new data unit fits well enough within any of the clusters of the cluster index 312, as described in more details elsewhere herein. If the data unit fits well enough within a cluster, the cluster assignment logic may assign the data unit to the cluster, and send the assigned cluster 320 and the ID(s) 322 of the reference unit(s) of the cluster to the compression logic 324 to be compressed. If the cluster assignment logic 318 determines that the data unit does not fit well enough within any of the clusters, it may not send any assigned cluster or one or more reference unit IDs to the compression logic 324, but rather just send the data unit to the compression logic 324 (or other compression logic) with instructions (not shown) to perform self-compression on the data unit.

In some embodiments, the data unit 316 may be a modified existing data unit, in which case the cluster assignment logic 318 may be configured to send instructions (not shown) to cluster logic (e.g., the cluster generation logic 306 or other logic) to remove the data unit from its currently assigned cluster before performing the steps to assign the cluster (or self-compress it) as described above and elsewhere herein. In such embodiments, cluster logic (e.g., the cluster assignment logic 318 and/or the cluster generation logic 306) may be configured to determine whether the modified data unit is a reference unit of a cluster, in which case the cluster logic may initiate the cluster generation logic 306 or other logic to de-designate the data unit as a reference unit and determine one or more reference units to replace it.

In some embodiments, an I/O operation may specify to delete a data unit, in which case the data unit may be removed from its assigned cluster; and if the deleted unit is a reference unit, one or more new reference units may be determined for the previously assigned cluster, for example, as described in more detail elsewhere herein.

The compression logic 324 may be configured to receive data units and apply dictionary-based compression using cluster information, in accordance with compression parameters 328, to produce compressed units 326. The compression logic 324 may be configured to receive cluster information 310 from cluster generation logic 306, along with one or more instructions 330 from cluster generation logic 306 and/or a human to compress data units 304 in accordance with the cluster information 310 and compression parameters 328, for example, as part of performing offline compression of a dataset including data units 304. Such compression may be performed in response to completion of the generation of the cluster information 310 for the data units 304. In response to receiving such instructions 330, the compression logic 324 may retrieve the data units 304 corresponding to the cluster information 310 from the data storage 301, and perform the compression on the data units 304 to produce compressed units 326, which may be stored in the data storage 301.

The compression logic 324 also may be configured to receive a single data unit 316, an assigned cluster 320 and one or more reference unit IDs 322, access the corresponding reference unit(s) of the data units 304 from the data store 301, and apply the reference units(s) as dictionaries to the data unit 316, in accordance with compression parameters 328 to produce a compressed unit (i.e., the data unit 316 in compressed form) 326, which may be stored in the data storage 301. Such compression may be performed in accordance with one of more instructions 330 received from the cluster assignment logic 306 and/or a user.

It should be appreciated that the cluster generation logic 306 and the cluster assignment logic 318 may be integrated as part of more general clustering logic. Such clustering logic may include one or more physically discrete components that are separate and distinct from one or more physically discrete components that implement the compression logic 324, or the clustering logic and the compression logic 324 may be integrated, in whole or in part, on a same one or more physically discrete components, or in software and/or firmware. More generally, it should be appreciated that each of the cluster generation logic 306, the cluster assignment logic 318 and the compression logic 324 may be implemented, discretely or integrated to at least some degree, as hardware, firmware and/or software, and may be considered to be, and referred to as, an engine (e.g., a compression engine or clustering engine). For example, each such logic, alone in in any suitable combination, may be implemented in any of the following types of hardware, which may be programmed with firmware and/or software: one or more CPUs; one or more GPUs; one or more micro-controllers; one or more application-specific integrated circuits (ASICs); one or more system-on-chips (SoCs); one or more field programmable gate arrays (FPGAs); variations of any of the foregoing; and any suitable combination of one of the foregoing. In particular, one or more aspects of compression as described herein may be implemented using QAT technology.

In some embodiments of the invention, the system 300 may include de-compression logic (not shown), for example, as part of more general compression logic or as a separate, discrete logical component, embodied in one or more of the various forms described above and elsewhere herein. Such de-compression logic may be configured to decompress compressed data units using the reference units that were used to compress them. For example, the de-compression logic may be configured to receive a compressed unit 326, reference information 310 to determine the reference unit for the compressed unit 326, and to retrieve the determined reference unit from among the data units 304 in the data storage 301. Such de-compression logic also may be configured with de-compression parameters, which may be similar to, or the same as, the compression parameters 328, and may be configured to receive one or more instructions (e.g., from a user or automated process), which triggers the decompression process. For example, a read operation may trigger the retrieval of the compressed data unit and de-compression thereof. The decompressed data unit may be sent to a requesting entity (e.g., a host that issued a read operation) and may be stored as a data unit 304.

It should be appreciated that hardware implementations of the foregoing logic are faster, but more expensive, than software-based implementations, and that software-based implementations afford more flexibility. In some embodiments of the invention, the use of clustering and dictionary-based compression as described herein produces not only improved compression ratios over known systems, in particular non-dictionary-based (e.g., self-compression-based) systems, but also increased compression speeds. In some embodiments, the gains in compression speed, in particular over non-dictionary-based compression, may be so great that it may be acceptable and/or desirable to implement the dictionary-based compression in software to save cost and afford more flexibility.

Figure 4:
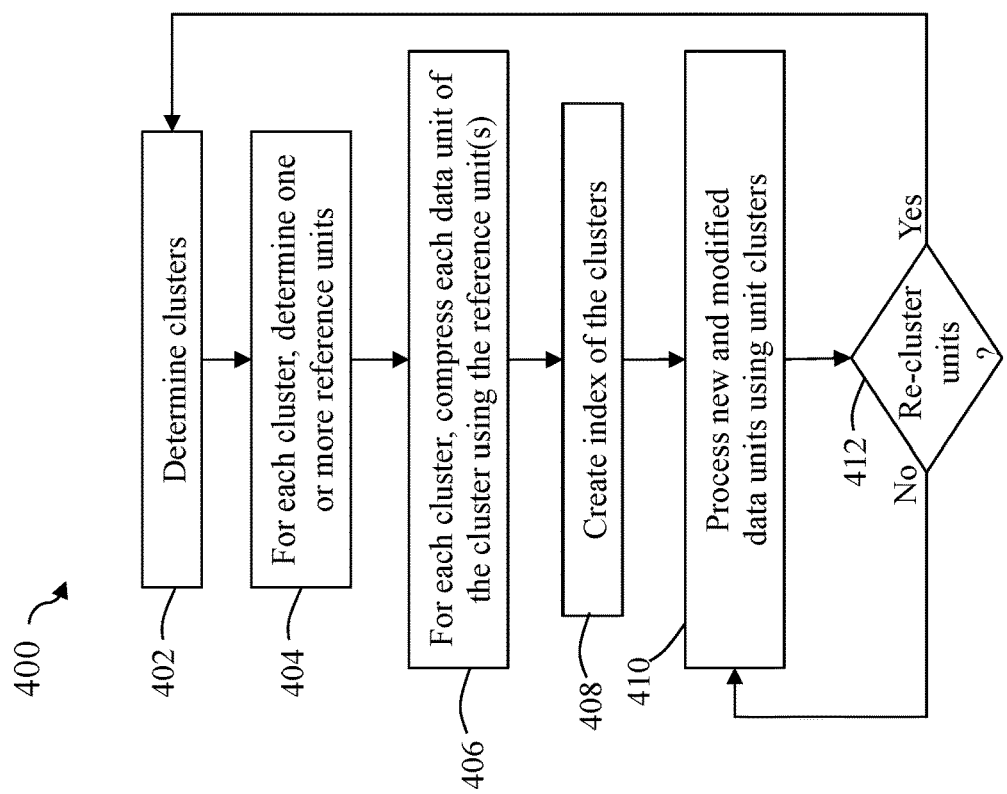
FIG. 4 is a flow chart illustrating an example of a method of compressing data units, according to embodiments of the invention.

FIG. 4 is a flow chart illustrating an example of a method 400 of compressing data units, according to embodiments of the invention. Other embodiments of a method of compressing data units, for example, variations of the method 400, are possible and are intended to fall within the scope of the invention.

In a step 402, clusters (e.g., a unit cluster and/or hash cluster) may be determined for data units of a dataset, for example, as described in more detail elsewhere herein. In some embodiments, the step 402 or portions thereof, are implemented using a method 500 described in connection with FIG. 5.

In a step 404, for each determined cluster, one or more reference units may be determined, for example, as described in more detail elsewhere herein. In some embodiments, the steps 402 and 404 are not separate, discrete steps performed in series, but rather these steps may be performed concurrently at least in part.

In a step 406, for each cluster, each data unit of the cluster may be compressed using the reference unit as a dictionary, for example, as described in more detail elsewhere herein. In a step 408, an index (e.g., a Faiss index) of clusters (unit clusters or hash clusters) may be created, for example, as described in more detail elsewhere herein.

In a step 410, new and modified data units (e.g., specified as part of a write operation) may be processed, for example, as described in more detail elsewhere herein. In some embodiments, the step 410 or portions thereof, are implemented using a method 600 described in connection with FIG. 6.

In a step 412, it may be determined whether to re-cluster the dataset, for example, based on measured metrics, as described in more detail elsewhere herein.

Figure 5:
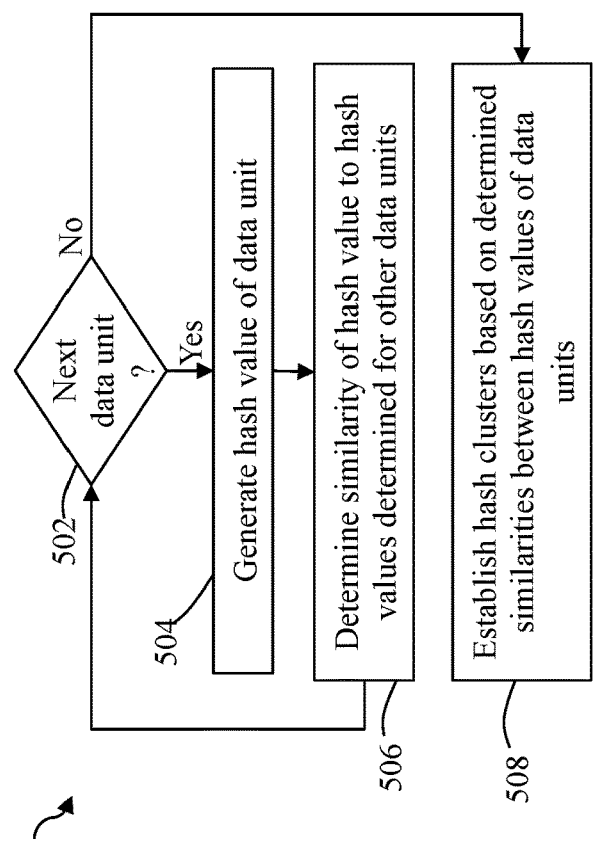
FIG. 5 is a flow chart illustrating an example of a method of clustering data units, according to embodiments of the invention.

FIG. 5 is a flow chart illustrating an example of the method 500 of clustering data units, according to embodiments of the invention. Other embodiments of a method of clustering data units, for example, variations of the method 500, are possible and are intended to fall within the scope of the invention. The method 500 may loop through all of the data units of a dataset for which clustering is performed, generated a hash value of each data unit, and cluster the data units based on the hash values.

In a step 502, it may be determined whether there is a next data unit (e.g., block) of a dataset (e.g., logical volume, storage group, data storage system, etc.) for which to generate a hash value, for example, a first data unit of the dataset on a first pass through steps 502-506.

In a step 504, a hash value may be generated from the data unit, for example, using an LSH function as described in more detail elsewhere herein. In a step 506, similarities between the hash values and hash values of other data units may be determined, for example, by determining a Euclidean distance between the hash value as described in detail elsewhere herein.

In a step 508, hash clusters may be established based on the determined similarities between the hash values, for example, based on similarities (or sameness) between hash values of the data units, for example, as described in more detail elsewhere herein. It should be appreciated that the step 508 of establishing hash clusters may be performed concurrently, at least in part, to the steps 502-506. Further, while the method 500 describes an embodiment in which hash values and hash clusters are employed, the invention is not so limited, as in some embodiments hash values are not generated, and unit clusters are generated from the data units themselves.

Figure 6:
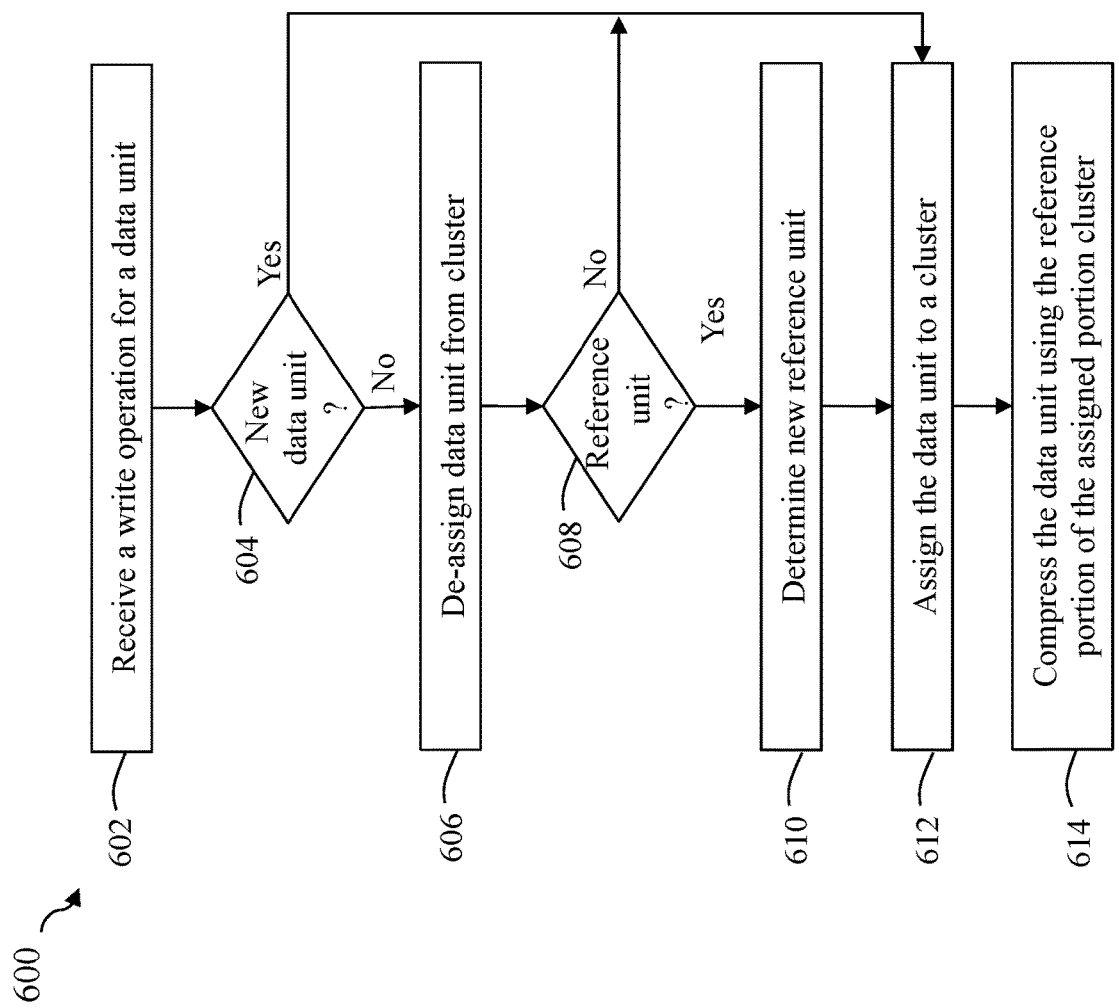
FIG. 6 is a flow chart illustrating an example of a method of compressing a data unit in response to a write operation, according to embodiments of the invention.

FIG. 6 is a flow chart illustrating an example of a method 600 of compressing a data unit in response to a write operation, according to embodiments of the invention. Other embodiments of a method of compressing a new data unit in response to a write operation, for example, variations of the method 600, are possible and are intended to fall within the scope of the invention.

In a step 602, a write operation is received for a data unit, for example from a host. In a step 604, it may be determined whether the unit is a new data unit, i.e., a data unit that has not yet been compressed, either as part of an initial compression of a dataset involving the generation of clusters or in response to a later write operation. For example, one or more data structures may be maintained that specify a list of data units that have been compressed, and this data structure may be accessed as part of performing the step 604.

If the data unit is a new data unit, in a step 612 the data unit may be assigned to a cluster (e.g., a unit cluster or a hash cluster), for example, as described in more detail elsewhere herein. If the data unit is not a new data unit, the write operation represents a modification to the data unit, and in a step 606, the data unit may be de-assigned from its current cluster.

In a step 608, it may be determined whether the data unit is a reference unit of a cluster, and, if so, a new reference unit may be determined in a step 610. For example, the reference unit may be de-designated as a reference unit to be used for new data units of its cluster going forward, and one or more new reference units may be determined for the cluster according to techniques described elsewhere herein in more detail. Even though the data unit is de-designated as the reference unit for new data units added to the cluster going forward, the data unit still may be retained and continued to be used as a reference unit for current data units of the cluster, which used the reference unit as a dictionary when compressed, and which may need to use the reference unit to decompress. After performance of the step 610, the method may proceed to the step 612. If it is determined in the step 608 that the data unit is not a reference unit, the method 600 may proceed to the step 612.

Returning to the step 604, in some embodiments, even if the data unit is modified, it is not de-assigned, and the data unit is compressed against the reference unit, unless the data unit is the reference unit, in which case it may be self-compressed. In some embodiments, even if the data unit is a reference unit, it is not de-designated as such.

In some embodiments of the invention, an I/O operation may be received that specifies to delete a data unit (e.g., as opposed to receiving a write operation in the step 602). In such embodiments, the steps 606, 608 and 610 may be performed, as described above, to execute the delete operation, without performance of the steps 604, 612 and 614.

Various embodiments of the invention may be combined with each other in appropriate combinations. Additionally, in some instances, the order of steps in the flowcharts, flow diagrams and/or described flow processing may be modified, where appropriate. It should be appreciated that any of the methods described herein, including methods 400, 500 and 600, or parts thereof, may be implemented using one or more of the systems and/or data structures described in relation to FIGS. 1-3, or components thereof. Further, various aspects of the invention may be implemented using software, firmware, hardware, any suitable combination thereof and/or other computer-implemented modules or devices having the described features and performing the described functions. Logic that when executed performs methods described herein, steps thereof or portions of such methods or steps, may be implemented as software, firmware, hardware, or any suitable combination thereof.

Software implementations of embodiments of the invention may include executable code that is stored on one or more computer-readable media and executed by one or more processors. Each of the computer-readable media may be non-transitory and include a computer hard drive, ROM, RAM, flash memory, portable computer storage media such as a CD-ROM, a DVD-ROM, a flash drive, an SD card and/or other drive with, for example, a universal serial bus (USB) interface, and/or any other appropriate tangible or non-transitory computer-readable medium or computer memory on which executable code may be stored and executed by a processor. Embodiments of the invention may be used in connection with any appropriate OS.

As used herein, an element or operation recited in the singular and preceded with the word "a" or "an" should be understood as not excluding plural elements or operations, unless such exclusion is explicitly recited. References to "one" embodiment or implementation of the present disclosure are not intended to be interpreted as excluding the existence of additional embodiments that also incorporate the recited features. Furthermore, a description or recitation in the general form of "at least one of [a], [b] or [c]," or equivalent thereof, should be generally construed to include [a] alone, [b] alone, [c] alone, or any combination of [a], [b] and [c]. In addition, use of a an ordinal term, e.g., "first," "second" or the like, to qualify a term for an item having multiple instances of the same name does not necessarily indicate a priority, precedence or temporal order between the instances unless otherwise indicated, but rather such ordinal terms may be used merely to distinguish between the separate instances.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method comprising:
    for a first plurality of data units, determining a plurality of clusters of data units at a first point in time based on an extent of similarity of content between the first plurality of data units;
    for each of the plurality of clusters, selecting one or more of the data units of said each cluster as one or more reference portions for said each cluster;
    for each of the plurality of clusters, compressing each data unit of said each cluster based, at least in part, on the one or more reference portions of said each cluster;
    receiving, at a second point in time subsequent to the first point in time, a second plurality of data units;
    assigning each of the second plurality of data units to a respective one of the plurality of clusters based on an extent of similarity of content between said each data unit of the second plurality and a reference portion of the respective one of the plurality of clusters; and
    re-clustering, in accordance with one or more metrics at a third point in time subsequent to the second point in time, the plurality of clusters into a second plurality of clusters of data units based on an extent of similarity of content between data units of the first plurality and the second plurality.

2. The method of claim 1, wherein, for each of the plurality of clusters, each data unit of said each cluster is compressed using a compression technology that uses the one or more reference portions of said each cluster as a dictionary.

3. The method of claim 1, wherein said determining the plurality of clusters includes, for each of the first plurality of data units:
    generating a hash value for said each data unit; and
    determining an extent of similarity of said each data unit to other data units of the first plurality of data units based at least in part on the generated hash value.

4. The method of claim 1, wherein, for each of the plurality of clusters, said selecting one or more of the data units of said each cluster as the one or more reference portions for said each cluster includes running a clustering algorithm in training mode to select the one or more reference portions.

5. The method of claim 1, further comprising:
receiving a write operation to an additional data unit not included in the first plurality of data units;
assigning the additional data unit to a first of the plurality of clusters; and
compressing the additional data unit using one or more of the reference portions of the first cluster.

6. The method of claim 5, wherein the additional data unit is assigned to the first cluster based at least in part on its proximity in data space to a first of the one or more reference portions of the first cluster.

7. The method of claim 1, further comprising, for at least a first reference portion of a first of the plurality of clusters:
determining whether to maintain the first reference portion in compressed form or uncompressed form based at least on: how much memory space is consumed by the first reference portion in uncompressed form; and how frequently the first reference portion is used.

8. A system comprising:
one or more processors; and
one or more memories comprising code stored thereon that, when executed, performs a method comprising:
for a first plurality of data units, determining a plurality of clusters of data units at a first point in time based on an extent of similarity of content between the first plurality of data units;
for each of the plurality of clusters, selecting one or more of the data units of said each cluster as one or more reference portions for said each cluster;
for each of the plurality of clusters, compressing each data unit of said each cluster based, at least in part, on the one or more reference portions of said each cluster;
receiving, at a second point in time subsequent to the first point in time, a second plurality of data units;
assigning each of the second plurality of data units to a respective one of the plurality of clusters based on an extent of similarity of content between said each data unit of the second plurality and a reference portion of the respective one of the plurality of clusters; and
re-clustering, in accordance with one or more metrics at a third point in time subsequent to the second point in time, the plurality of clusters into a second plurality of clusters of data units based on an extent of similarity of content between data units of the first plurality and the second plurality.

9. The system of claim 8, wherein, for each of the plurality of clusters, each data unit of said each cluster is compressed using a compression technology that uses the one or more reference portions of said each cluster as a dictionary.

10. The system of claim 8, wherein said determining the plurality of clusters includes, for each of the first plurality of data units:
generating a hash value for said each data unit; and
determining an extent of similarity of said each data unit to other data units of the first plurality of data units based at least in part on the generated hash value.

11. The system of claim 8, wherein, for each of the plurality of clusters, said selecting one or more of the data units of said each cluster as the one or more reference portions for said each cluster includes running a clustering algorithm in training mode to select the one or more reference portions.

12. The system of claim 8, wherein the method further comprises:
receiving a write operation to an additional data unit not included in the first plurality of data units;
assigning the additional data unit to a first of the plurality of clusters; and
compressing the additional data unit using one or more of the reference portions of the first cluster.

13. The system of claim 12, wherein the additional data unit is assigned to the first cluster based at least in part on its proximity in data space to a first of the one or more reference portions of the first cluster.

14. The system of claim 8, wherein the method further comprises, for at least a first reference portion of a first of the plurality of clusters:
determining whether to maintain the first reference portion in compressed form or uncompressed form based at least on: how much memory space is consumed by the first reference portion in uncompressed form;
and how frequently the first reference portion is used.

15. One or more non-transitory computer-readable media having software stored thereon, the software comprising:
executable code that, for a first plurality of data units, determines a plurality of clusters of data units at a first point in time based on an extent of similarity of content between the first plurality of data units;
executable code that, for each of the plurality of clusters, selects one or more of the data units of said each cluster as one or more reference portions for said each cluster;
executable code that, for each of the plurality of clusters, compresses each data unit of said each cluster based, at least in part, on the one or more reference portions of said each cluster;
executable code that receives, at a second point in time subsequent to the first point in time, a second plurality of data units;
executable code that assigns each of the second plurality of data units to a respective one of the plurality of clusters based on an extent of similarity of content between said each data unit of the second plurality and a reference portion of the respective one of the plurality of clusters; and
executable code that re-clusters, in accordance with one or more metrics at a third point in time subsequent to the second point in time, the plurality of clusters into a second plurality of clusters of data units based on an extent of similarity between data units of the first plurality and the second plurality.

16. The one or more non-transitory computer-readable media of claim 15, wherein, for each of the plurality of clusters, each data unit of said each cluster is compressed using a compression technology that uses the one or more reference portions of said each cluster as a dictionary.

17. The one or more non-transitory computer-readable media of claim 15, wherein the executable code that determines determining the plurality of clusters includes, executable code that, for each of the first plurality of data units:
generates a hash value for said each data unit; and
determines an extent of similarity of said each data unit to other data units of the first plurality of data units based at least in part on the generated hash value.

18. The one or more non-transitory computer-readable media of claim 15, wherein the software further comprises:

executable code that receives a write operation to an additional data unit not included in the first plurality of data units;

executable code that assigns the additional data unit to a first of the plurality of clusters; and executable code that compresses the additional data unit using the one or more reference portions of the first cluster.

19. The one or more non-transitory computer-readable media of claim 18, wherein the additional data unit is assigned to the first cluster based at least in part on its proximity in data space a first of the one or more reference portions of the first cluster.

20. The one or more non-transitory computer-readable media of claim 15, wherein the software further comprises, for at least a first reference portion of a first of the plurality of clusters:

executable code that determines whether to maintain the first reference portion in compressed form or uncompressed form based at least on: how much memory space is consumed by the first reference portion in uncompressed form; and how frequently the first reference portion is used.

\* \* \* \* \*